(12) United States Patent
Wang et al.

(10) Patent No.: US 10,192,963 B2
(45) Date of Patent: Jan. 29, 2019

(54) COMPOSITE GATE DIELECTRIC LAYER APPLIED TO GROUP III-V SUBSTRATE AND METHOD FOR MANUFACTURING THE SAME

(71) Applicant: Institute Of Microelectronics, Chinese Academy of Science, Beijing (CN)

(72) Inventors: Shengkai Wang, Beijing (CN); Honggang Liu, Beijing (CN); Bing Sun, Beijing (CN); Hudong Chang, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 15/539,597

(22) PCT Filed: Jul. 16, 2015

(86) PCT No.: PCT/CN2015/084198
§ 371 (c)(1),
(2) Date: Jun. 23, 2017

(87) PCT Pub. No.: WO2017/008293
PCT Pub. Date: Jan. 19, 2017

(65) Prior Publication Data
US 2017/0365672 A1  Dec. 21, 2017

(51) Int. Cl.
*H01L 29/40* (2006.01)
*H01L 21/02* (2006.01)
(Continued)

(52) U.S. Cl.
CPC ........ *H01L 29/408* (2013.01); *H01L 21/0228* (2013.01); *H01L 21/02178* (2013.01);
(Continued)

(58) Field of Classification Search
CPC ......... H01L 21/02178; H01L 21/02192; H01L 21/02194
See application file for complete search history.

(56) References Cited

U.S. PATENT DOCUMENTS

2005/0202659 A1   9/2005   Li et al.

FOREIGN PATENT DOCUMENTS

| CN | 1825628 A | 8/2006 |
|---|---|---|
| CN | 102024707 A | 4/2011 |

(Continued)

OTHER PUBLICATIONS

International Search Report with translation from corresponding PCT Application No. PCT/CN2015/084198 dated Apr. 7, 2016.

*Primary Examiner* — Samuel Gebremariam
*Assistant Examiner* — Jonas T Beardsley
(74) *Attorney, Agent, or Firm* — Christensen, Fonder, Dardi & Herbert PLLC

(57) ABSTRACT

The present invention discloses a composite gate dielectric layer for a Group III-V substrate and a method for manufacturing the same. The composite gate dielectric layer comprises: an $Al_xY_{2-x}O_3$ interface passivation layer formed on the group III-V substrate; and a high dielectric insulating layer formed on the $Al_xY_{2-x}O_3$ interface passivation layer, wherein $1.2 \leq x \leq 1.9$. The composite gate dielectric layer modifies the Al/Y ratio of the $Al_xY_{2-x}O_3$ interface passivation layer, changes the average number of atomic coordination in the $Al_xY_{2-x}O_3$ interface passivation layer, and decreases the interface state density and boundary trap density of the Group III-V substrate, increases the mobility of the MOS channel. By cooperation of the $Al_xY_{2-x}O_3$ interface passivation layer and high dielectric insulation layer, it reduces leakage current and improves tolerance of the dielectric layer on the voltage, and improves the quality (Continued)

of the MOS capacitor of the Group III-V substrate and enhances its reliability.

13 Claims, 3 Drawing Sheets

(51) Int. Cl.
    *H01L 21/28*     (2006.01)
    *H01L 29/20*     (2006.01)
    *H01L 29/51*     (2006.01)
    *H01L 21/285*     (2006.01)
    *H01L 29/423*     (2006.01)

(52) U.S. Cl.
    CPC .. *H01L 21/02192* (2013.01); *H01L 21/02301* (2013.01); *H01L 21/02356* (2013.01); *H01L 21/285* (2013.01); *H01L 21/28264* (2013.01); *H01L 29/42364* (2013.01); *H01L 29/513* (2013.01); *H01L 29/517* (2013.01); *H01L 29/20* (2013.01)

(56) References Cited

FOREIGN PATENT DOCUMENTS

| | | |
|---|---|---|
| CN | 102683208 A | 9/2012 |
| CN | 105097901 A | 11/2015 |

COMPOSITE GATE DIELECTRIC LAYER APPLIED TO GROUP III-V SUBSTRATE AND METHOD FOR MANUFACTURING THE SAME

CROSS REFERENCE TO RELATED APPLICATIONS

This application is a national stage filing of PCT Application Number PCT/CN2015/084198 filed Jul. 16, 2015, is hereby incorporated herein by reference.

TECHNICAL FIELD

The present invention relates to a composite gate dielectric structure applied to a group III-V substrate, and more particularly to a composite gate dielectric layer applied to a group III-V substrate and a method for manufacturing the same.

BACKGROUND

With continuous developments of microelectronic technology, III-V group compound semiconductors, such as InGaAs, InP, InAs, GaAs, GaSb, etc., are superior to silicon in terms of electron mobility or hole mobility, so they are considered to be an important alternative to replace metal for manufacturing silicon channel of metal-oxide-semiconductor field effect transistor (MOSFET) in more-Moore ages.

There are plenty of interfacial trap densities at interfaces of Group III-V substrate and a gate dielectric, which is generally at 1-2 orders of magnitude higher than that of an interface of $SiO_2/Si$. The higher interfacial trap density will greatly decrease the carrier mobility, which leads to an increased on-resistance and increased power consumption. At present, the interface quality and overall properties of the gate dielectric/Group III-V substrate have been improved by the researcher utilizing methods such as $Al_2O_3$ surface passivation, interface sulfur treatment and surface nitridation on the basis of atomic layer deposition technology. However, it is still poorer as compared with the $SiO_2/Si$ interface quality.

In addition, from the viewpoint of reliability and power consumption of the device, it provides many challenges for the Group III-V substrate and gate dielectric structure. Most of the current gate dielectric structure has disadvantages of large leakage current of the gate dielectric and poor reliability. It is a critical technical about how to fabricate gate dielectrics with high reliability, low defect interface state density and ultra-low equivalent oxide thickness on the surface of the Group III-V substrate so as to apply Group III-V substrate in logic devices in the post-mole technology era.

SUMMARY

A main object of the present invention is to provide a composite gate dielectric layer for a Group III-V substrate and a method for manufacturing the same, which reduces interfacial state density and border trap density and increases a mobility of III-V group MOS channel, reduces leakage current of the gate. It further improves capability of withstanding the electrical field of the dielectric layer and improves the quantity of the III-V group MOS substrate and enhances its reliability.

In order to achieve the above object, the present invention provides a composite gate dielectric layer for a Group III-V substrate comprising: an $Al_xY_{2-x}O_3$ interface passivation layer formed on the group III-V substrate; and a high dielectric insulating layer formed on the $Al_xY_{2-x}O_3$ interface passivation layer, wherein $1.2 \leq x \leq 1.9$.

In the above mentioned technical solution, the group III-V substrate includes a GaAs substrate, an InP substrate, a GaSb substrate, an InAs substrate or an InGaAs substrate and an epitaxial wafer thereof, the doping concentration of which is equal to or more than $1 \times 10^{15}$ cm$^{-3}$ and equal to or less than $5 \times 10^{17}$ cm$^{-3}$.

In the above mentioned technical solution, the $Al_xY_{2-x}O_3$ interface passivation layer has a thickness of 0.4 nm or more and 4 nm or less.

In the above mentioned technical solution, the high dielectric insulating layer includes $HfO_2$, $ZrO_2$, $La_2O_3$ or $Y_2O_3$, and a ternary or plural compound obtained by mixing the above mentioned four materials, wherein the high dielectric insulating layer has a thickness of 0 nm or more and less than or equal to 4 nm.

In order to achieve the above object, the present invention also provides a method for manufacturing a composite gate dielectric layer for a group III-V substrate, comprising the following steps of:

Step 1: cleaning the group III-V substrate, growing an $Al_2O_m$ passivation layer on the group III-V substrate, wherein $2.5 \leq m \leq 3$;

Step 2: growing a $Y_2O_n$ strengthening layer on the $Al_2O_m$ passivation layer, wherein $2.5 \leq m \leq 3$;

Step 3: thermally treating the $Al_2O_m$ passivation layer and the $Y_2O_n$ strengthening layer in situ to mix the $Al_2O_m$ passivation layer and the $Y_2O_n$ strengthening layer to obtain an interface passivation layer of $Al_xY_{2-x}O_3$, wherein $1.2 \leq x \leq 1.9$; and Step 4: growing a high dielectric constant insulating layer on the $Al_xY_{2-x}O_3$ interface passivation layer.

In the above mentioned technical solution, the step 1 of growing the $Al_2O_m$ passivation layer on the group III-V substrate comprises growing an $Al_2O_m$ passivation layer with a thickness of $d_1$ on the group III-V substrate by atomic layer deposition at a temperature of 200° C. to 400° C., wherein 0.2 nm $\leq d_1 \leq$ 3.8 nm.

In the above mentioned technical solution, the method regulates an oxygen content in the $Al_2O_m$ passivation layer by adjusting the temperature of atomic layer deposition ranging from 200° C. to 400° C., wherein at 200° C., it tends to form a $Al_2O_m$ passivation layer with a low oxygen content, m=2.5; at 400° C., it tends to form a $Al_2O_m$ passivation layer with a high oxygen content, m=3. The lower oxygen content in the $Al_2O_m$ passivation layer may improve a flexibility of the Al—O tetrahedron network structure in the $Al_2O_m$ passivation layer, and enhance a characteristic of rotation of the Al—O tetrahedron in the $Al_2O_m$ passivation layer, so as to passivize the defects on the surface of the group III-V substrate. The higher oxygen content in the $Al_2O_m$ passivation layer may decrease the leakage current of the composite gate dielectric layer and improve the reliability.

In the above mentioned technical solution, the step 2 of growing the $Y_2O_n$ strengthening layer on the $Al_2O_m$ passivation layer comprises growing the $Y_2O_n$ strengthening layer with a thickness of $d_2$ on the $Al_2O_m$ passivation layer by atomic layer deposition at a temperature of 200° C. to 400° C., wherein 0.4 nm $\leq d_1 + d_2 \leq$ 4 nm.

In the above mentioned technical solution, the method regulates an oxygen content in the $Y_2O_n$ strengthening layer by adjusting the temperature of the atomic layer deposition ranging from 200° C. to 400° C., wherein at 200° C., it tends to form a $Y_2O_n$ strengthening layer with a low oxygen content, n=2.5; at 400° C., it tends to form a $Y_2O_n$ strengthening layer with a high oxygen content, n=3.

In the above mentioned technical solution, the step 3 of thermally treating the $Al_2O_m$ passivation layer and the $Y_2O_n$ strengthening layer in situ is implemented by thermally treating the $Al_2O_m$ passivation layer and the $Y_2O_n$ strengthening layer in an atomic layer deposition apparatus at a temperature ranging from 200° C. to 400° C.

In the above mentioned technical solution, the $Al_2O_m$ passivation layer and the $Y_2O_n$ strengthening layer are mixed according to a certain mixing ratio by adjusting the temperature for the thermal treating in situ, and the mixing ratio is determined by a ratio of $d_1:d_2$ of the thickness $d_1$ of the $Al_2O_m$ passivation layer and the thickness $d_2$ of the $Y_2O_n$ strengthening layer, wherein $19:1 \leq d_1:d_2 \leq 1:19$. In such a method, the $Al_xY_{2-x}O_3$ interface passivation layer is obtained by mixing the $Al_2O_m$ passivation layer and $Y_2O_n$ strengthening layer to implement an average coordination number of the $Al_xY_{2-x}O_3$ interface passivation layer ranging from 2.8 to 4.2, and in turn to meet the requirement of interfacial trap density and reliability of various devices. The average coordination number of 2.8 is obtained under a condition in which $d_1:d_2=19:1$, m=3 and n=3; and the average coordination number of is 4.2 is obtained under a condition in which $d_1:d_2=1:19$, m=2.5 and n=2.5.

In the above mentioned technical solution, in the $Al_xY_{2-x}O_3$ interface passivation layer, $1.2 \leq x \leq 1.9$ is a referable result of the interface passivation layer, and the average coordination number of the $Al_xY_{2-x}O_3$ interface passivation layer ranges from 3.28 to 2.86, in which the average coordination number is 3.28 at x=1.2 and 2.86 at x=1.9.

In the above mentioned technical solution, the step 4 of growing the high dielectric insulating layer on the $Al_xY_{2-x}O_3$ interface passivation layer is implemented by utilizing atomic layer deposition to deposit a high dielectric insulating layer with a thickness of equal to or more than 0 nm and less than or equal to 4 nm on the $Al_xY_{2-x}O_3$ interface passivation layer at a temperature ranging from of 200° C. to 400° C.

As can be seen from the above technical solutions, the present invention has the following advantageous effects.

The composite gate dielectric layer for group III-V substrate and method for manufacturing the same provided by the present invention utilizes an $Al_xY_{2-x}O_3$ interface passivation layer by adjusting the oxygen concentration in the $Al_2O_m$ and doping $Y_2O_n$ to soften the $Al_2O_m$ network structure. Thus, there is much freedom of distortion among the Al—O tetrahedron and it is easy for the $Al_xY_{2-x}O_3$ to be bonded with the surface defects of group III-V substrate to passivate the interface defects.

The composite gate dielectric layer for group III-V substrate and method for manufacturing the same provided by the present invention utilizes an $Al_xY_{2-x}O_3$ interface passivation layer by adjusting the oxygen concentration in the $Al_2O_m$ and doping $Y_2O_n$ to improve the average coordination number of $Al_xY_{2-x}O_3$. Although the Al—O tetrahedron may be distorted, it is still attracted around $Y^{3+}$ ion by 7-coordinated $Y^{3+}$ ion to become compacter. Such an interface layer has a lower Gibbs free energy and it is not easy for the interface layer to break the ion bond under a larger electric stress, which decreases leakage current of the gate and improves reliability.

The composite gate dielectric layer for group III-V substrate and method for manufacturing the same provided by the present invention utilizes an $Al_xY_{2-x}O_3$ interface passivation layer. As compared with a single $Al_2O_3$ interface passivation layer (with a dielectric constant k of about 8), the $Al_xY_{2-x}O_3$ interface passivation layer utilized by the present invention has a higher dielectric constant (which a dielectric constant k of about 12). Meanwhile, it is helpful to implement a thinner equivalent oxide by cooperation of the $HfO_2$, $ZrO_2$, $La_2O_3$, $Y_2O_3$ with a high dielectric constant and mixing the four types of materials as mentioned above to obtain the ternary or plural compound.

BRIEF DESCRIPTION OF THE DRAWINGS

In order to further illustrate the present invention, the present invention will be described in detail with reference to the accompanying drawings, in which.

DETAILED DESCRIPTION

In order to make the object, technical solution and advantages of the present invention to be more apparent, the invention will be described in conjunction with particular embodiments and with reference to the accompanying drawings.

Figure 1:
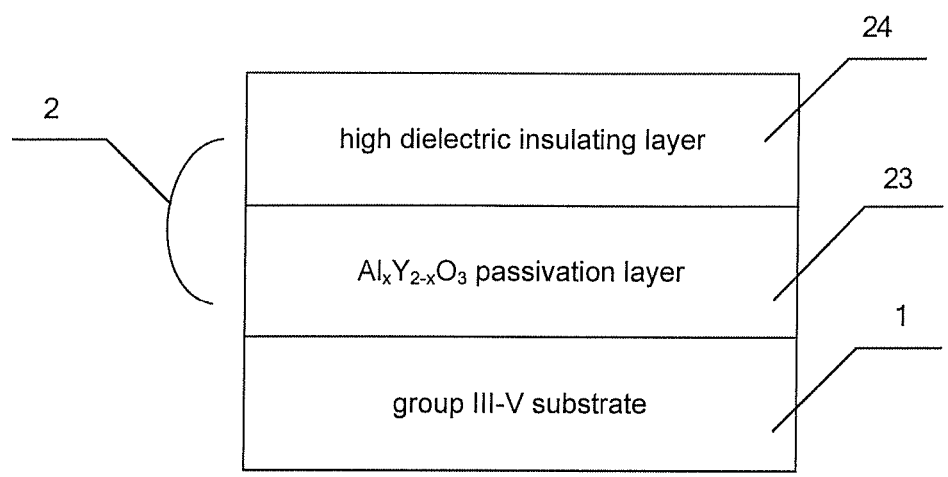
FIG. 1 is a schematic structural view of a composite gate dielectric layer for a group III-V substrate provided by the present invention.

As shown in FIG. 1, FIG. 1 is a schematic structural view of a composite gate dielectric layer for a group III-V substrate provided by the present invention. The composite gate dielectric layer comprises: an $Al_xY_{2-x}O_3$ interface passivation layer formed on the group III-V substrate; and a high dielectric insulating layer formed on the $Al_xY_{2-x}O_3$ interface passivation layer, wherein $1.2 \leq x \leq 1.9$. The $Al_xY_{2-x}O_3$ interface passivation layer 23 and the $HfO_2$ high dielectric insulating layer 24 constitute a composite gate dielectric layer 2.

In FIG. 1, the group III-V substrate 1 includes a GaAs substrate, an InP substrate, a GaSb substrate, an InAs substrate or an InGaAs substrate and an epitaxial wafer thereof, the doping concentration of which is equal to or more than $1 \times 10^{15}$ $cm^{-3}$ and equal to or less than $5 \times 10^{17}$ $cm^{-3}$. The $Al_xY_{2-x}O_3$ interface passivation layer 23 has a thickness of 0.4 nm or more and 4 nm or less. The high dielectric insulating layer 24 includes $HfO_2$, $ZrO_2$, $La_2O_3$ or $Y_2O_3$, and a ternary or plural compound obtained by mixing the above mentioned four materials, wherein the high dielectric insulating layer 24 has a thickness of 0 nm or more and less than or equal to 4 nm.

Figure 2:
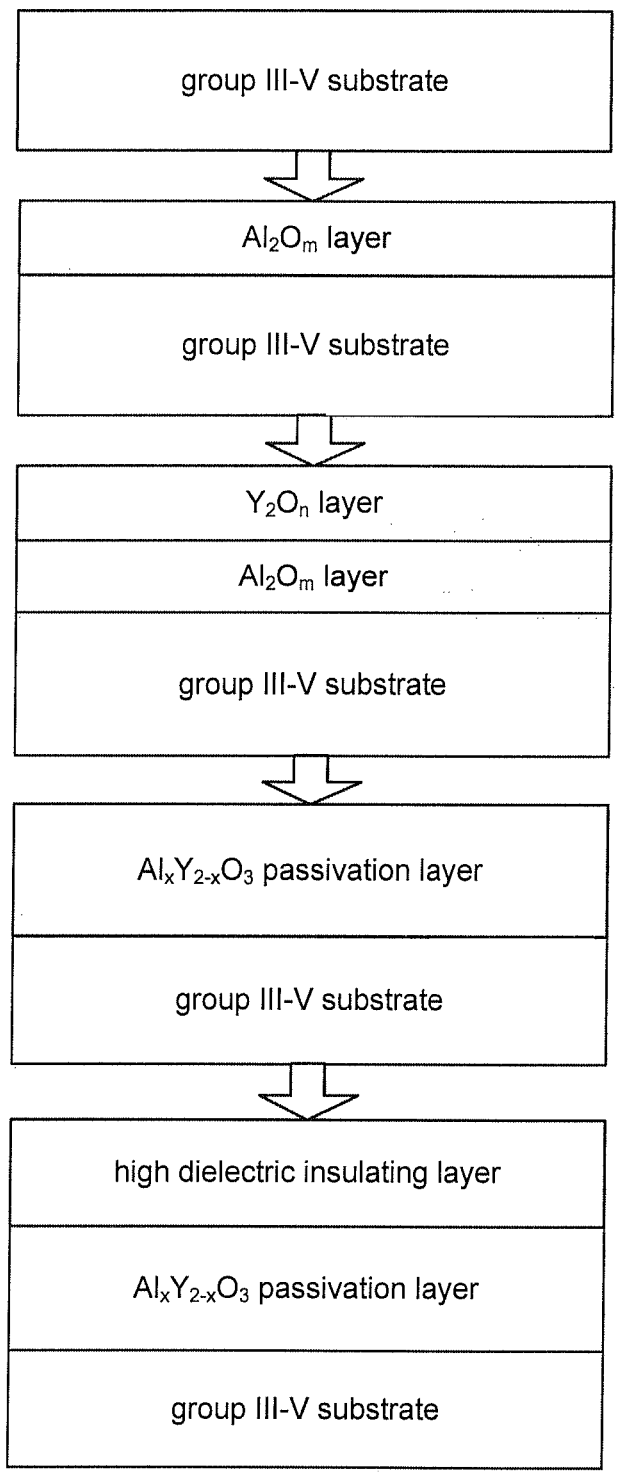
FIG. 2 is a process flowchart for manufacturing the composite gate dielectric layer as shown in FIG. 1 provided by the present invention.

FIG. 2 is a process flowchart for manufacturing the composite gate dielectric layer as shown in FIG. 1 provided by the present invention. As can be seen from FIG. 2, the $Al_xY_{2-x}O_3$ interface passivation layer 23 formed on the group III-V substrate 1 is obtained by an in situ thermal treatment, i.e. an in situ anneal treatment to mutually diffuse the $Al_2O_m$ passivation layer 21 and the $Y_2O_n$ strengthening layer 22.

The gate dielectric layer composed of the $Al_xY_{2-x}O_3$ interface passivation layer 23 and the $HfO_2$ high dielectric insulating layer 24 is a composite gate dielectric layer, which may reduce the interface state density and the boundary trap density, increase the MOS channel mobility, reduces the leakage current of the gate, and further improve the tolerance of the dielectric layer on the voltage and improve the quality and reliability of MOS device.

Figure 3:
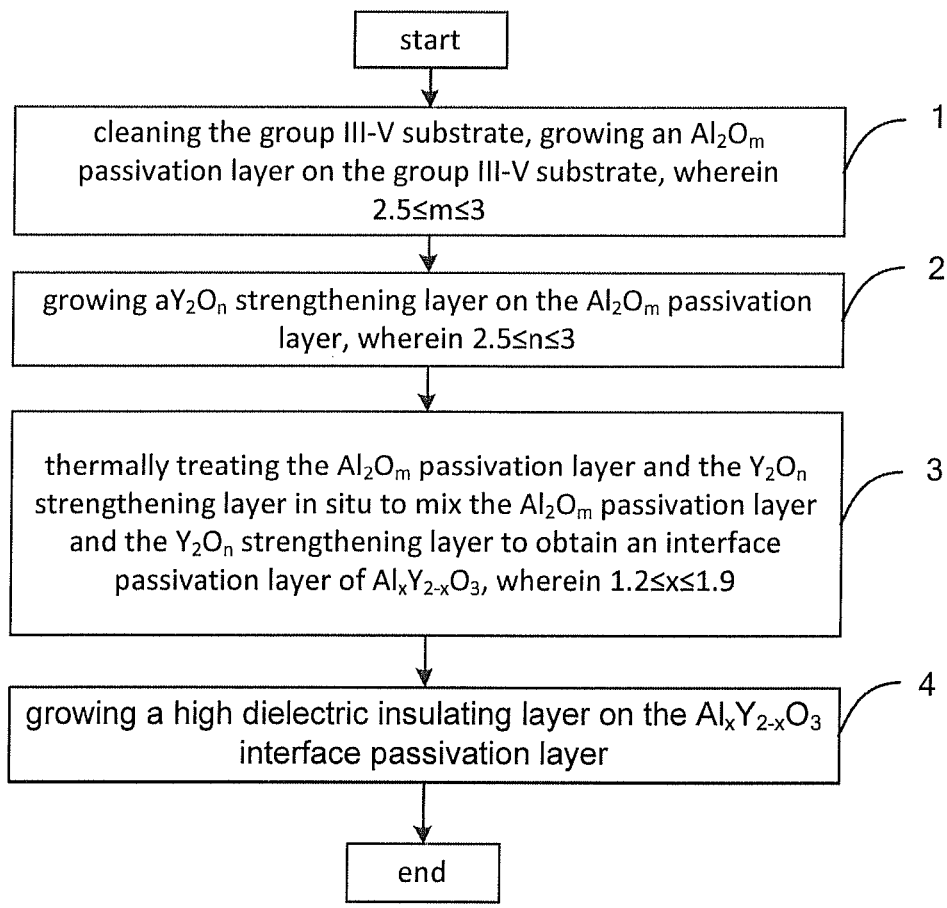
FIG. 3 is a flowchart of a method for manufacturing the composite gate dielectric layer as shown in FIG. 1 provided by the present invention.

FIG. 3 is a flowchart of a method for manufacturing the composite gate dielectric layer as shown in FIG. 1 provided by the present invention. The method comprises the following steps.

At step 1: cleaning the group III-V substrate, growing an $Al_2O_m$ passivation layer on the group III-V substrate, wherein $2.5 \leq m \leq 3$.

In such a step, the step of growing the $Al_2O_m$ passivation layer on the group III-V substrate comprises growing an $Al_2O_m$ passivation layer with a thickness of $d_1$ on the group III-V substrate by atomic layer deposition at a temperature of 200° C. to 400° C., wherein $0.2 \text{ nm} \leq d_1 \leq 3.8$ nm. the method regulates an oxygen content in the $Al_2O_m$ passivation layer by adjusting the temperature of atomic layer deposition ranging from 200° C. to 400° C., wherein at 200° C., it tends to form a $Al_2O_m$ passivation layer with a low oxygen content, $m=2.5$; at 400° C., it tends to form a $Al_2O_m$ passivation layer with a high oxygen content, $m=3$. The lower oxygen content in the $Al_2O_m$ passivation layer may improve a flexibility of the Al—O tetrahedron mesh structure in the $Al_2O_m$ passivation layer, and enhance a characteristic of rotation of the Al—O tetrahedron in the $Al_2O_m$ passivation layer, so as to passivize the defects on the surface of the group III-V substrate. The higher oxygen content in the $Al_2O_m$ passivation layer may decrease the leakage current of the composite gate dielectric layer and improve the reliability.

Step 2: growing a $Y_2O_n$ strengthening layer on the $Al_2O_m$ passivation layer, wherein $2.5 \leq n \leq 3$.

In such a step, the step of growing the $Y_2O_n$ strengthening layer on the $Al_2O_m$ passivation layer comprises growing the $Y_2O_n$ strengthening layer with a thickness of $d_2$ on the $Al_2O_m$ passivation layer by atomic layer deposition at a temperature of 200° C. to 400° C., wherein $0.4 \text{ nm} \leq d_1 + d_2 \leq 4$ nm. The method regulates an oxygen content in the $Y_2O_n$ strengthening layer by adjusting the d temperature of the atomic layer deposition ranging from 200° C. to 400° C., wherein at 200° C., it tends to form a $Y_2O_n$ strengthening layer with a low oxygen content, $n=2.5$; at 400° C., it tends to form a $Y_2O_n$ strengthening layer with a high oxygen content, $n=3$.

Step 3: thermally treating the $Al_2O_m$ passivation layer and the $Y_2O_n$ strengthening layer in situ to mix the $Al_2O_m$ passivation layer and the $Y_2O_n$ strengthening layer to obtain an interface passivation layer of $Al_xY_{2-x}O_3$, wherein $1.2 \leq 1.9$.

In such a step, the step of thermally treating the $Al_2O_m$ passivation layer and the $Y_2O_n$ strengthening layer in situ is implemented by thermally treating the $Al_2O_m$ passivation layer and the $Y_2O_n$ strengthening layer in an atomic layer deposition apparatus at a temperature ranging from 200° C. to 400° C. In the above mentioned technical solution, the $Al_0O_m$ passivation layer and the $Y_2O_n$ strengthening layer are mixed according to a certain mixing ratio by adjusting the temperature for the thermal treating in situ, and the mixing ratio is determined by a ratio of $d_1:d_2$ of the thickness $d_1$ of the $Al_2O_m$ passivation layer and the thickness $d_2$ of the $Y_2O_n$ strengthening layer, wherein $19:1 \leq d_1:d_2 \leq 1:19$. In such a method, the $Al_xY_{2-x}O_3$ interface passivation layer is obtained by mixing the $Al_2O_m$ passivation layer and $Y_2O_n$ strengthening layer to implement an average coordination number of the $Al_xY_{2-x}O_3$ interface passivation layer ranging from 2.8 to 4.2, and in turn to meet the requirement of interfacial defect density and reliability of various devices. The average coordination number of 2.8 is obtained under a condition in which $d_1:d_2=19:1$, $m=3$ and $n=3$; and the average coordination number of is 4.2 is obtained under a condition in which $d_1:d_2=1:19$, $m=2.5$ and $n=2.5$. In the $Al_xY_{2-x}O_3$ interface passivation layer, $1.2 \leq x \leq 1.9$ is a referable result of the interface passivation layer, and the average coordination number of the $Al_xY_{2-x}O_3$ interface passivation layer ranges from 3.28 to 2.86, in which the average coordination number is 3.28 at $x=1.2$ and 2.86 at $x=1.9$.

Step 4: growing a high dielectric insulating layer on the $Al_xY_{2-x}O_3$ interface passivation layer.

In such a step, the step of growing the high dielectric insulating layer on the $Al_xY_{2-x}O_3$ interface passivation layer is implemented by utilizing atomic layer deposition to deposit a high dielectric insulating layer with a thickness of equal to or more than 0 nm and less than or equal to 4 nm on the $Al_xY_{2-x}O_3$ interface passivation layer at a temperature ranging from of 200° C. to 400° C.

Embodiment 1

A method of manufacturing a composite gate dielectric layer for a group III-V substrate in accordance with the embodiment 1 of the present invention comprises the following steps.

In a step 101, an InP substrate with a thickness of 400 μm and an N-type doping concentration of $5 \times 10^{15}$ cm$^{-3}$ is cleaned, and then $Al_2O_{2.5}$ layer with a thickness of 0.5 nm is grown by atomic layer deposition at 200° C. The step 101 particularly comprises the following sub steps.

In a step 101.1: the InP substrate is immerged completely in absolute ethanol in which the surface of the InP substrate directs upwards, and is washed with ultrasonic wave for 3 minutes to remove partially polarized organic material on the surface;

In a step 101.2: the InP substrate after being processed in the step 101.1 is immersed in a deionized water for 15 seconds and then taken out;

In a step 101.3: the InP substrate after being processed in the step 101.2 is completely immersed in acetone in which the surface of the InP substrate directs upwards, and is cleaned by ultrasonic wave for 3 minutes to remove the unpolarized organic substance on the surface;

In a step 101.4: the InP substrate after being processed in the step 101.3 is immersed in the deionized water for 15 seconds and then taken out;

In a step 101.5: a concentrated hydrochloric acid (mass fraction ratio of 37%) and a deionized water are mixed in a volume ratio of 1:9; the InP substrate after being processed in the step 101.4 in which the surface of the InP substrate directs upwards is completely immersed into the dilute hydrochloric acid solution and maintained for one minute;

In a step 101.6: the InP substrate after being processed in the step 101.5 is immersed in the deionized water for 15 seconds and taken out;

In a step 101.7: the InP substrate after being processed in the step 101.6 in which the surface of the InP substrate directs upwards is completely immersed in a solution of ammonia sulfide $(NH_4)_2S$ with a mass fraction of 22% for 15 minutes;

In a step 101.8: the InP substrate after being processed in the step 101.7 is immersed in deionized water for 15 seconds and then taken out and quickly dried with nitrogen gas.

In a step 101.9: the InP substrate after being processed in the step 101.8 is placed in the atomic layer deposition apparatus, and trimethylaluminum and water are used as a reaction precursor (in an order of introducing trimethylaluminum firstly and then water) to grow an $Al_2O_5$ layer with a thickness of 0.5 nm at 200° C. by atomic layer deposition.

In a step 102: a Yttrium tris(butylcyclopentadienide) and water were used as reaction precursors (in an order of introducing water firstly and then yttrium tris (butylcyclopentadienyl)) to grow a $Y_2O_3$ layer with a thickness of 0.3 nm by atomic layer deposition.

In a step 103: the grown $Al_2O_5$ layer and the $Y_2O_3$ layer are subjected to an in-situ thermal treatment in an atomic layer deposition apparatus at 300° C. to obtain an $Al_{1.25}Y_{0.75}O_3$ interface passivation layer with a thickness of 0.8 nm. The step 103 particularly comprises the following sub steps.

Step 103.1: After the step 102 is completed, a nitrogen gas with a purity of 99.999% is introduced into the atomic layer deposition chamber, and the pressure is maintained at 50 Pascals until the gas pressure became stable.

Step 103.2: an in-situ annealing treatment is carried out at a temperature of 300° C. for 30 minutes to diffuse Al and Y atoms to form an $Al_{1.25}Y_{0.75}O_3$ interface passivation layer with an average coordination number of 3.25 and a thickness of 0.8 nm.

Step 104: an atomic layer deposition method is used to grow a $HfO_2$ layer with a thickness of 3 nm at 300° C. on the annealed $Al_{1.25}Y_{0.75}O_3$ interface passivation layer by using bi-(ethylcyclopentadienyl) hafnium dichloride and water as the reaction precursor (in an order of introducing bi-(ethylcyclopentadienyl) hafnium dichloride firstly and then water).

Example 2

A method of manufacturing a composite gate dielectric layer for a group III-V substrate in accordance with the embodiment 2 of the present invention comprises the following steps.

In a step 201: an $In_{0.53}Ga_{0.47}As$ substrate with an epitaxial layer thickness of 20 nm and an N-type doping concentration of $1 \times 10^{18}$ $cm^{-3}$ on a silicon-based insulator is cleaned. The silicon substrate is intrinsic silicon and a thickness of the insulating layer is 50 nm. Then an $Al_2O_{2.5}$ layer with a thickness of 0.3 nm is grown at 200° C. by atomic layer deposition. The step 201 particularly comprises the following sub steps.

In a step 201.1: the $In_{0.53}Ga_{0.47}As$ substrate on the silicon-based insulator is completely submerged in anhydrous ethanol and cleaned by ultrasonic for 3 minutes to remove the partially polarized organic material on the surface;

In a step 201.2: the $In_{0.53}Ga_{0.47}As$ substrate on the silicon-based insulator after being processed in the step 201.1 is immersed in the deionized water for 15 seconds and then taken out;

In a step 201.3: the $In_{0.53}Ga_{0.47}As$ substrate on the silicon-based insulator after being processed in the step 201.2 is completely immersed into acetone in which its surface direct upwards, and is cleaned by ultrasonic wave for 3 minutes to remove the unpolarized organic substance on the surface;

In a step 201.4: the $In_{0.53}Ga_{0.47}As$ substrate on the silicon-based insulator after being processed in the step 201.3 is immersed in the deionized water for 15 seconds and then taken out;

In a step 201.5: a concentrated hydrochloric acid (mass fraction of 37%) and deionized water are mixed in a volume ratio of 1:4; the surface of the $In_{0.53}Ga_{0.47}As$ substrate on the silicon-based insulator after being processed in the step 201.4 is completely immersed into the mixed dilute hydrochloric acid solution for 1 minute;

In a step 201.6: the $In_{0.53}Ga_{0.47}As$ substrate on the silicon-based insulator after being processed in the step 201.5 is immersed in the deionized water for 15 seconds and then taken out;

In a step 201.7: the surface of the $In_{0.53}Ga_{0.47}As$ substrate on the silicon-based insulator after being processed in the step 201.6 is imergened in a solution of ammonium sulfide $(NH_4)_2S$ with a mass ratio of 22% in for 15 minutes;

In a step 201.8: the $In_{0.53}Ga_{0.47}As$ substrate on the silicon-based insulator after being processed in the step 201.7 is immersed in the deionized water for 15 seconds, then taken out and rapidly dried with nitrogen.

In a step 201.9: the $In_{0.53}Ga_{0.47}As$ substrate on the silicon-based insulator after being processed in the step 201.8 is placed in an atomic layer deposition apparatus, and trimethylaluminum and water are used as reaction precursors (in an order of introducing trimethylaluminum firstly and then water) to grow an $Al_2O_{2.5}$ layer with a thickness of 0.3 nm at 200° C. by using atomic layer deposition.

In a step 202: yttrium tris (butylcyclopentadienide) and water are used as reaction precursors (in an order of introducing yttrium tris (butylcyclopentadienyl) firstly and then water) at 300° C. to grow a $Y_2O_3$ layer with a thickness of 0.3 nm by using atomic layer deposition.

In a step 203: the grown $Al_2O_5$ layer and the $Y_2O_3$ layer are thermally treated in-situ in an atomic layer deposition apparatus at 300° C. to obtain an $AlYO_3$ interface passivation layer having a thickness of 0.6 nm. The step 203 particularly comprised the following sub steps.

In a step 203.1: after the step 202 is completed, a nitrogen gas having a purity of 99.999% is introduced into the atomic layer deposition chamber, and the pressure is maintained at 50 Pascals until the gas pressure became stable.

In a step 203.2: an in-situ annealing treatment is carried out at a temperature of 300° C. for 30 minutes to diffuse Al and Y atoms to form an $AlYO_3$ interface passivation layer with an average coordination number of 3.4 nm and a thickness of 0.6 nm.

In a step 204: a layer of $Hf_{0.9}Y_{0.13}O_2$ with a thickness of 3 nm is grown on the $AlYO_3$ interface passivation layer after it is annealed at 300° C. by using atomic layer deposition. The step 204 particularly comprises the following sub steps.

In a step 204.1: after the step 203.2, bi-(ethylcyclopentadienyl) hafnium dichloride and water are used as reaction precursors at 300° C. (in an order of introducing bi-(ethylcyclopentadienyl) hafnium dichloride firstly and then water) to grow a $HfO_2$ layer with a thickness of 1.35 nm by atomic layer deposition;

In a step 204.2: after the step 204.1, yttrium tris (butylcyclopentadiene) and water are used as the reaction precursor at 300° C. (in an order of introducing yttrium tris (butylcyclopentadienyl) firstly and then water) to grow a $Y_2O_3$ layer with a thickness of 0.3 nm at 300° C. by atomic layer deposition.

In a step 204.3: after the step 204.2, bi-(ethylcyclopentadienyl) hafnium dichloride and water are used as the reaction precursors at 300° C. (in an order of introducing bi-(ethylcyclopentadienyl) hafnium dichloride firstly and then water) to grow a $HfO_2$ layer with a thickness of 1.35 nm.

In a step 204.4: After the step 204.3, a nitrogen gas with a purity of 99.999% is introduced into the atomic layer deposition chamber, and the pressure is maintained at 50 Pascals until the gas pressure became stable.

In a step 204.5: an in-situ annealing is carried out at a temperature of 300° C. for 30 minutes to diffuse the Hf and Y atoms to form a high dielectric insulating layer of $Hf_{0.9}Y_{0.13}O_2$ with a thickness of 3 nm.

Example 3

A method of manufacturing a composite gate dielectric layer for a group III-V substrate in accordance with the embodiment 3 of the present invention comprises the following steps.

In a step 301: a GaAs substrate with a thickness of 400 m and an N-type doping concentration of $1\times10^{17}$ cm$^{-3}$ is cleaned, and then a $Al_2O_{2.7}$ layer is grown at 250° C. to have a thickness of 2 nm by an atomic layer deposition. The step 301 particularly comprises the following sub steps:

In a step 301.1: the GaAs substrate in which its surface directs upward is completely immersed in absolute ethanol and cleaned by ultrasonic wave for 3 minutes to remove the partially polarized organic substance on the surface;

In a step 301.2: the GaAs substrate after being processed in the step 301.1 is immersed in the deionized water for 15 seconds and then taken out;

In a step 301.3: the surface of the GaAs substrate after being processed in the step 301.2 is completely immersed in acetone and cleaned by ultrasonic wave for 3 minutes to remove the unpolarized organic substance on the surface;

In a step 301.4: the GaAs substrate after being processed in the step 301.3 is immersed in the deionized water for 15 seconds and then taken out;

In a step 301.5: a concentrated hydrochloric acid (with a mass fraction of 37%) and deionized water are mixed in a volume ratio of 1:4; the InP substrate in which its surface directs upwards after being processed in the step 101.4 is completely immersed into the diluted hydrochloric acid solution to maintain 1 minute;

In a step 301.6: the GaAs substrate after being processed in the step 301.5 is immersed in the deionized water for 15 seconds and then taken out;

In a step 301.7: the GaAs substrate in which its surface direct upwards after being processed in the step 301.6 is immerged in a solution of ammonium sulfide $(NH_4)_2S$ with a mass ratio of 22% for 15 minutes;

In a step 301.8: the GaAs substrate after being processed in the step 301.7 is immersed in the deionized water for 15 seconds, then taken out and rapidly dried with nitrogen gas;

In a step 301.9: the GaAs substrate after being processed in the step 301.8 is placed in the atomic layer deposition apparatus and trimethylaluminum and water are used as the reaction precursors (in an order of introducing the trimethylaluminum firstly and then water) to grow a $Al_2O_{2.7}$ layer with a thickness of 2 nm at 250° C. by atomic layer deposition.

In a step 302: Yttrium tris(butylcyclopentadienide) and water are used as reaction precursors (in an order of introducing yttrium tris(butylcyclopentadienyl) firstly and then water) to grow a $Y_2O_3$ layer with a thickness of 0.3 nm at 300° C. by atomic layer deposition.

In a step 303: the grown $Al_2O_{2.7}$ layer and the $Y_2O_3$ layer are thermally treated in situ in the atomic layer deposition equipment at a temperature of 300° C. to obtain the $Al_{1.74}Y_{0.26}O_3$ interface passivation layer with a thickness of 2.3 nm.

In a step 303.1: After the step 302 is completed, a nitrogen gas with a purity of 99.999% is introduced into the atomic layer deposition chamber, and the pressure is maintained at 50 Pascals until the gas pressure became stable.

In a step 303.2: an In-situ annealing treatment is carried out at a temperature of 300° C. for 30 minutes to diffuse Al and Y atoms to form an $Al_{1.74}Y_{0.26}O_3$ interfacial passivation layer with an average coordination number of 2.96 and a thickness of 2.3 nm.

In a step 304, treated with bis(ethylcyclopentadienyl) hafnium dichloride and water are used as the reaction precursors (in an order of introducing bis(ethylcyclopentadienyl) hafnium dichloride firstly and water) to grown a $HfO_2$ layer with a thickness of 2 nm at 300° C. on the annealed $Al_{1.74}Y_{0.26}O_3$ interfacial passivation layer by atomic layer deposition While the invention has been described in detail with reference to specific embodiments thereof, it is to be understood that the above is intended only as illustrative and not restrictive, and that the invention is not limited to the particular embodiments, Any modifications, equivalent substitutions, improvements and the like within the spirit and principles of the present invention are intended to be included within the scope of the present invention.

We claim:

1. A composite gate dielectric layer for a Group III-V substrate, comprising:
    an $Al_xY_{2-x}O_3$ interface passivation layer formed on the group III-V substrate by thermally treating an $Al_2O_m$ passivation layer formed on the group III-V substrate and a $Y_2O_n$ strengthening layer formed on the $Al_2O_m$ passivation layer in situ to mix the $Al_2O_m$ passivation layer and the $Y_2O_n$ strengthening layer; and
    a high-k dielectric insulating layer formed on the $Al_xY_{2-x}O_3$ interface passivation layer, wherein $1.2 \leq x \leq 1.9$.

2. The composite gate dielectric layer for a Group III-V substrate according to claim 1, wherein the group III-V substrate includes a GaAs substrate, an InP substrate, a GaSb substrate, an InAs substrate or an InGaAs substrate and an epitaxial wafer thereof, the doping concentration of which is equal to or more than $1\times10^{15}$ cm$^{-3}$ and equal to or less than $5\times10^{17}$ cm$^{-3}$.

3. The composite gate dielectric layer for a Group III-V substrate according to claim 1, wherein the $Al_xY_{2-x}O_3$ interface passivation layer has a thickness of 0.4 nm or more and 4 nm or less.

4. The composite gate dielectric layer for a Group III-V substrate according to claim 1, wherein the high-k dielectric insulating layer includes $HfO_2$, $ZrO_2$, $La_2O_3$ or $Y_2O_3$, and a ternary or plural compound obtained by mixing the above mentioned four materials, wherein the high-k dielectric insulating layer has a thickness of 0 nm or more and less than or equal to 4 nm.

5. A method for manufacturing a composite gate dielectric layer for a group III-V substrate, comprising the following steps of:
    Step 1: cleaning the group III-V substrate, growing an $Al_2O_m$ passivation layer on the group III-V substrate, wherein $2.5 \leq m \leq 3$;
    Step 2: growing a $Y_2O_n$ strengthening layer on the $Al_2O_m$ passivation layer, wherein $2.5 \leq n \leq 3$;
    Step 3: thermally treating the $Al_2O_m$ passivation layer and the $Y_2O_n$ strengthening layer in situ to mix the $Al_2O_m$ passivation layer and the $Y_2O_n$ strengthening layer to obtain an interface passivation layer of $Al_xY_{2-x}O_3$, wherein $1.2 \leq x \leq 1.9$; and
    Step 4: growing a high-k dielectric insulating layer on the $Al_xY_{2-x}O_3$ interface passivation layer.

6. The method according to claim 5, wherein the step 1 of growing the $Al_2O_m$ passivation layer on the group III-V substrate comprises growing the $Al_2O_m$ passivation layer with a thickness of $d_1$ on the group III-V substrate by atomic layer deposition at a temperature of 200° C. to 400° C., wherein 0.2 nm≤$d_1$≤3.8 nm.

7. The method according to claim 6, wherein the method regulates an oxygen content in the $Al_2O_m$ passivation layer by adjusting the temperature of atomic layer deposition ranging from 200° C. to 400° C., wherein at 200° C., it tends to form a $Al_2O_m$ passivation layer with a low oxygen content, m=2.5; at 400° C., it tends to form a $Al_2O_m$ passivation layer with a high oxygen content, m=3, wherein the lower oxygen content in the $Al_2O_m$ passivation layer improves a flexibility of the Al—O tetrahedron mesh structure in the $Al_2O_m$ passivation layer, and enhances a characteristic of rotation of the Al—O tetrahedron in the $Al_2O_m$ passivation layer, so as to passivize the defects on the surface of the group III-V substrate, and the higher oxygen content in the $Al_2O_m$ passivation layer decreases the leakage current of the composite gate dielectric layer and improve the reliability.

8. The method according to claim 6, wherein the step 2 of growing the $Y_2O_n$ strengthening layer on the $Al_2O_m$ passivation layer comprises growing the $Y_2O_n$ strengthening layer with a thickness of $d_2$ on the $Al_2O_m$ passivation layer by atomic layer deposition at a temperature of 200° C. to 400° C., wherein 0.4 nm≤$d_1$+$d_2$≤4 nm.

9. The method according to claim 8, wherein the method regulates an oxygen content in the $Y_2O_n$ strengthening layer by adjusting the temperature of the atomic layer deposition ranging from 200° C. to 400° C., wherein at 200° C., it tends to form a $Y_2O_n$ strengthening layer with a low oxygen content, n=2.5; at 400° C., it tends to form a $Y_2O_n$ strengthening layer with a high oxygen content, n=3.

10. The method according to claim 5, wherein the step 3 of thermally treating the $Al_2O_m$ passivation layer and the $Y_2O_n$ strengthening layer in situ is implemented by thermally treating the $Al_2O_m$ passivation layer and the $Y_2O_n$ strengthening layer in an atomic layer deposition apparatus at a temperature ranging from 200° C. to 400° C.

11. The method according to claim 10, wherein the $Al_0O_m$ passivation layer and the $Y_2O_n$ strengthening layer are mixed according to a certain mixing ratio by adjusting the temperature for the thermal treating in situ, and the mixing ratio is determined by a ratio of d1:d2 of the thickness $d_1$ of the $Al_2O_m$ passivation layer and the thickness $d_2$ of the $Y_2O_n$ strengthening layer, wherein 19:1≤$d_1$:$d_2$≤1:19;

the $Al_xY_{2-x}O_3$ interface passivation layer is obtained by mixing the $Al_2O_m$ passivation layer and $Y_2O_n$ strengthening layer to implement an average coordination number of the $Al_xY_{2-x}O_3$ interface passivation layer ranging from 2.8 to 4.2, and in turn to meet the requirement of interfacial defect density and reliability of various devices; wherein the average coordination number of 2.8 is obtained under a condition in which $d_1$:$d_2$=19:1, m=3 and n=3; and the average coordination number of is 4.2 is obtained under a condition in which d1:d2=1:19, m=2.5 and n=2.5.

12. The method according to claim 11, wherein the $Al_xY_{2-x}O_3$ interface passivation layer, 1.2≤x≤1.9 is a referable result of the interface passivation layer, and the average coordination number of the $Al_xY_{2-x}O_3$ interface passivation layer ranges from 3.28 to 2.86, in which the average coordination number is 3.28 at x=1.2 and 2.86 at x=1.9.

13. The method according to claim 5, wherein the step 4 of growing the high-k dielectric insulating layer on the $Al_xY_{2-x}O_3$ interface passivation layer is implemented by utilizing atomic layer deposition to deposit a high dielectric insulating layer with a thickness of equal to or more than 0 nm and less than or equal to 4 nm on the $Al_xY_{2-x}O_3$ interface passivation layer at a temperature ranging from of 200° C. to 400° C.

* * * * *